United States Patent [19]
Ishikawa et al.

[11] Patent Number: 5,382,311
[45] Date of Patent: Jan. 17, 1995

[54] STAGE HAVING ELECTROSTATIC CHUCK AND PLASMA PROCESSING APPARATUS USING SAME

[75] Inventors: Kenji Ishikawa, Sagamihara; Mitsuaki Komino, Tokyo; Tadashi Mitui, Yamanashi; Teruo Iwata, Nirasaki; Izumi Arai, Yokohama; Yoshifumi Tahara, Tokyo, all of Japan

[73] Assignees: Tokyo Electron Limited, Tokyo; Tokyo Electron Yamanashi Limited, Nirasaki, both of Japan

[21] Appl. No.: 168,367

[22] Filed: Dec. 17, 1993

[30] Foreign Application Priority Data

Dec. 17, 1992 [JP] Japan ................................. 4-354709
Dec. 17, 1992 [JP] Japan ................................. 4-355240
Mar. 24, 1993 [JP] Japan ................................. 5-089239

[51] Int. Cl.⁶ .................................................. H01L 21/00
[52] U.S. Cl. .................................. 156/345; 118/723 E; 118/728
[58] Field of Search .................................. 156/345, 643; 118/723 E, 723 ER, 723 MW, 723 ME, 723 MR, 723 MA, 723 AN, 723 I, 723 IR, 728; 204/298.15

[56] References Cited

U.S. PATENT DOCUMENTS

| | | | |
|---|---|---|---|
| 4,565,601 | 1/1986 | Kakehi et al. | 156/345 X |
| 4,615,755 | 10/1986 | Tracy et al. | 156/345 |
| 4,645,218 | 2/1987 | Ooshio et al. | 279/1 M |
| 4,771,730 | 9/1988 | Tezuka | 118/723 E |
| 5,099,571 | 3/1992 | Logan et al. | 29/825 |
| 5,155,331 | 10/1992 | Horiuchi et al. | 156/345 X |
| 5,179,498 | 1/1993 | Hongoh et al. | 361/234 |
| 5,207,437 | 5/1993 | Barnes et al. | 279/128 |
| 5,213,349 | 5/1993 | Elliot | 279/128 |
| 5,255,153 | 10/1993 | Nozawa et al. | 361/234 |
| 5,279,865 | 1/1994 | Chebi et al. | 427/574 |
| 5,320,982 | 6/1994 | Tsubone et al. | 156/345 X |

FOREIGN PATENT DOCUMENTS

2-224241 9/1990 Japan.

Primary Examiner—R. Bruce Breneman
Assistant Examiner—Jonathan D. Baskin
Attorney, Agent, or Firm—Oblon, Spivak, McClelland, Maier & Neustadt

[57] ABSTRACT

A plasma etching apparatus for a semiconductor wafer includes a susceptor arranged in a vacuum process chamber. A groove for flowing a heat transfer gas is formed in the mounting surface of the susceptor. The groove includes an annular groove portion formed along the peripheral edge of the mounting surface, and a gas path vertically extending through the susceptor is connected to the annular groove portion. A sheet-like electrostatic chuck is airtightly adhered to the mounting surface of the susceptor to cover the groove. A plurality of through holes are formed in the electrostatic chuck, and these holes are arranged along an above the groove. The heat transfer gas is supplied between the electrostatic chuck and the semiconductor wafer through the gas path, the groove, and the through holes. The heat transfer gas contributes to transfer of cold from a liquid nitrogen source arranged under the susceptor to the wafer.

20 Claims, 8 Drawing Sheets

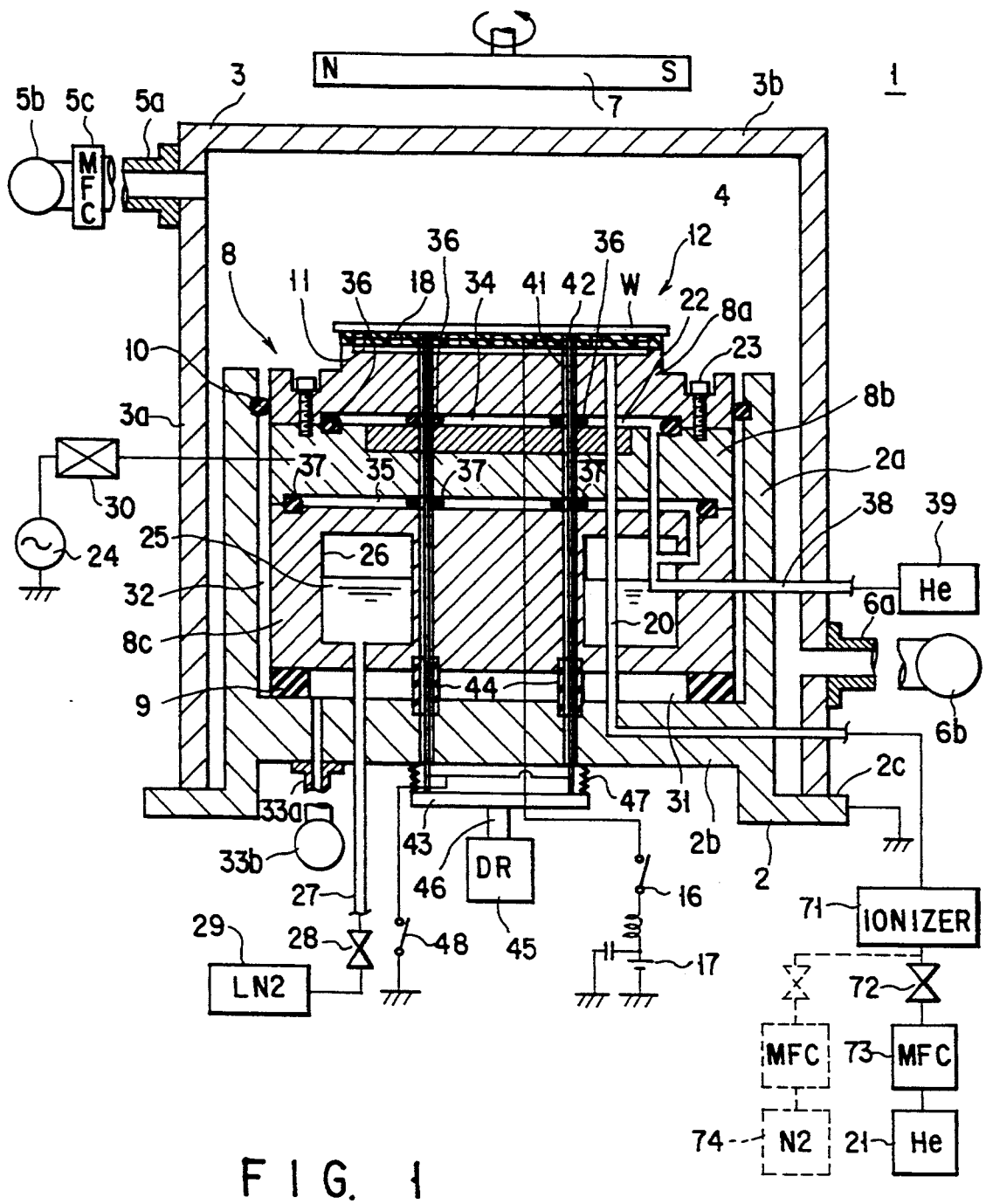
F I G. 1

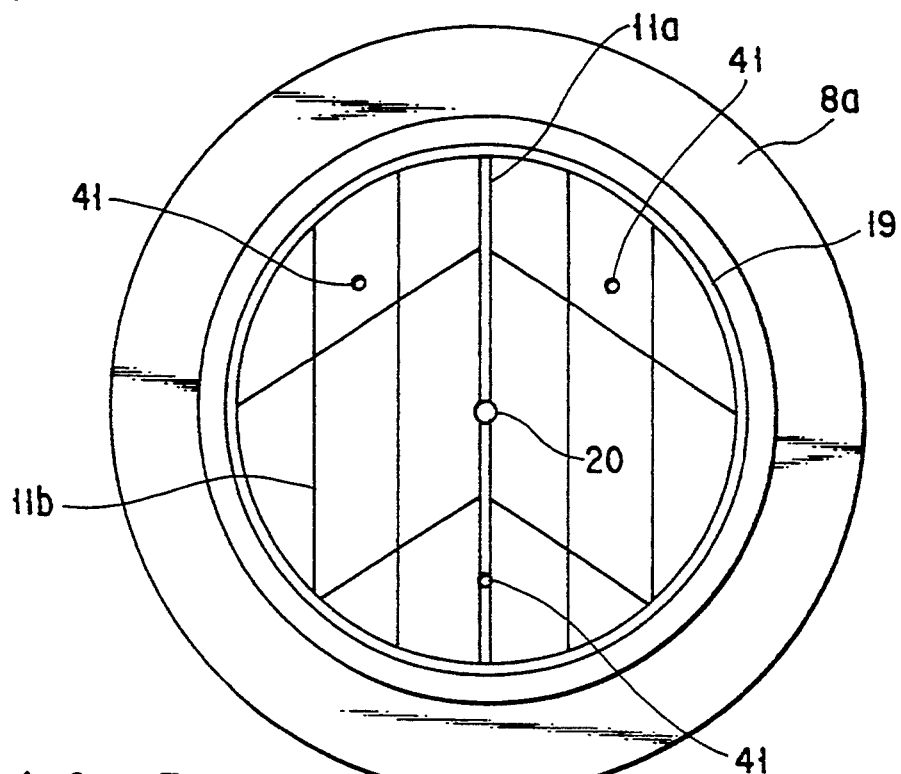
F I G. 5
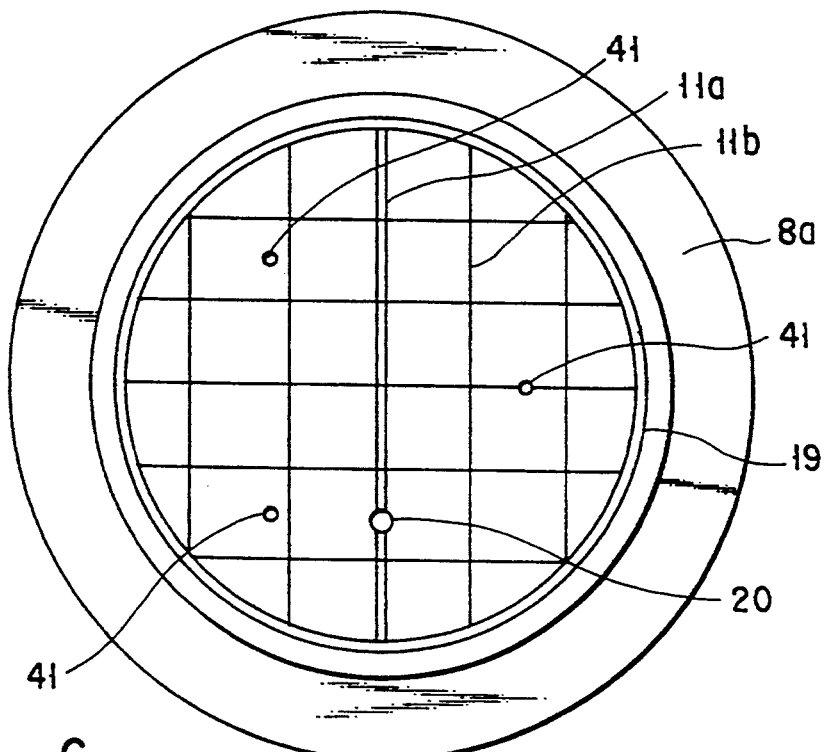
F I G. 6

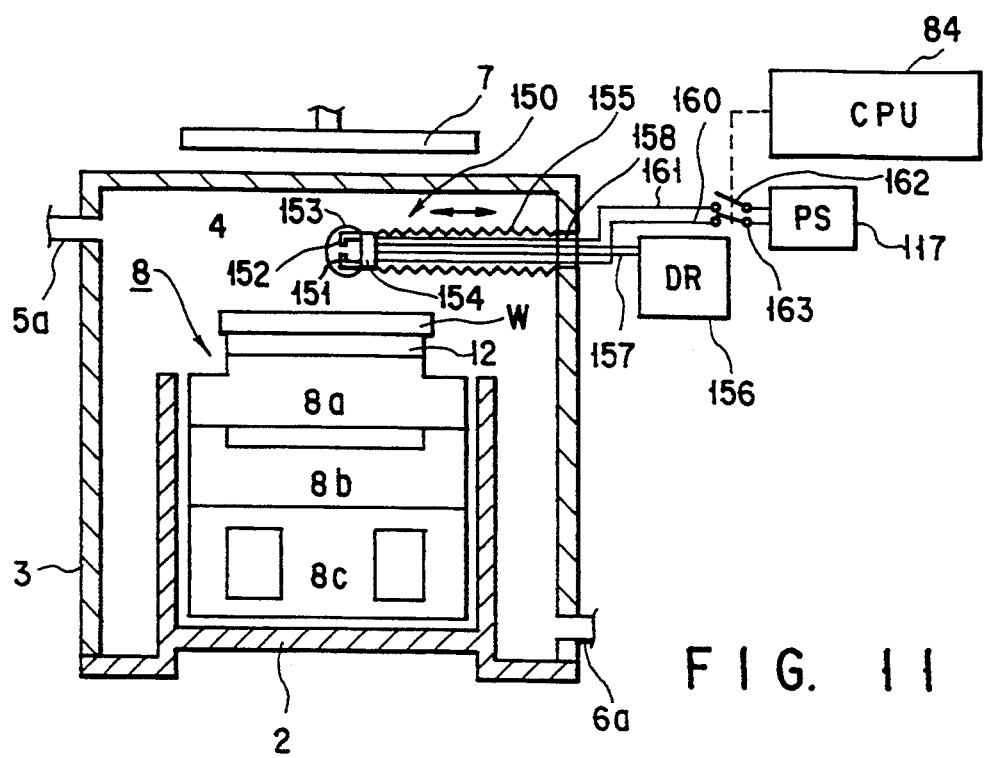
F I G. 11
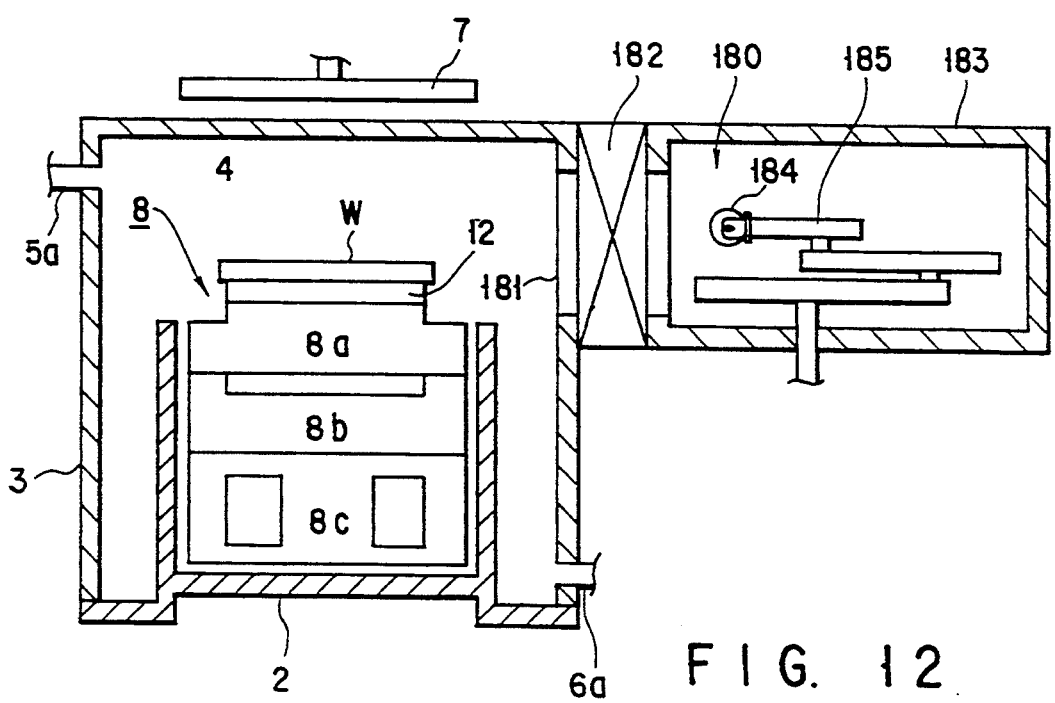
F I G. 12

STAGE HAVING ELECTROSTATIC CHUCK AND PLASMA PROCESSING APPARATUS USING SAME

BACKGROUND OF THE INVENTION

1. Field of the Invention

The present invention relates to a stage having an electrostatic chuck and used for attracting and holding a target substrate when the target substrate such as a semiconductor wafer is subjected to a process such as etching or film formation and to a plasma processing apparatus using this stage.

2. Description of the Related Art

In a processing apparatus such as a plasma etching apparatus in which semiconductor wafers are processed one by one, a susceptor functioning as a lower electrode is arranged in a process chamber capable of being set in a vacuum state. A wafer serving as a target substrate is placed and fixed on the susceptor, and is subjected to processing. As a means for fixing the wafer on the susceptor, a mechanical holding means such as a clamp and an electrostatic chuck for attracting and holding the wafer by Coulomb's force generated by static electricity are mainly used.

U.S. Pat. No. 4,771,730 (issued on Sep. 20, 1988) discloses an electrostatic chuck arranged on a susceptor or table for supporting a target substrate, e.g., a semiconductor wafer. The electrostatic chuck comprises two dielectric layers and an electrode interposed therebetween. The electrode is connected to the positive terminal of an external DC power supply. In addition, in order to efficiently transfer cold given to the susceptor to the wafer to control the temperature of the wafer, a heat transfer gas is supplied between the lower surface of the wafer and the upper dielectric layer of the electrostatic chuck.

A plurality of vertical holes are formed in the dielectric layers and electrode of the electrostatic chuck to supply the heat transfer gas. A plurality of vertical holes are formed in the susceptor to correspond to the vertical holes of the electrostatic chuck. A plurality of horizontal holes are formed inside the susceptor in a matrix form, a group of vertical holes arranged in a line communicate with one of the horizontal holes. The plurality of horizontal holes communicate with each other, and a supply line extending from a heat transfer gas source is connected to one portion of the horizontal holes.

The relationship between the vertical and horizontal holes in the susceptor is disclosed in U.S. Pat. No. 5,155,331 (issued on Oct. 13, 1992), though the apparatus disclosed in this patent uses a clamp in place of an electrostatic chuck.

However, side openings must be formed in the side surface of the susceptor to form the vertical and horizontal holes in the susceptor. Furthermore, these side openings must be finally sealed by a certain means. For this reason, formation of the susceptor is cumbersome, and the structure of the susceptor is complicated. Since heat loaded on the susceptor largely varies, the sealed opening may cause leakage of the heat transfer gas due to the influence of thermal expansion and contraction of the susceptor. An adhesive resistant to vacuum which is available at present for sealing such openings is vitrified at a temperature of, e.g., about −80° C., and its sealing function is degraded. If leakage of the heat transfer gas exceeds, e.g., 1 sccm, an etching selectivity is decreased.

When the vertical and horizontal holes have a complicated structure, the conductance of a supply path for the heat transfer gas is decreased, and a pressure reducing speed obtained when an initial low pressure is set before the wafer is placed is easily decreased. The complicated vertical and horizontal holes are easily clogged with a deposit, and the deposit is peeled to form particles in a processing atmosphere.

SUMMARY OF THE INVENTION

It is, therefore, an object of the present invention to provide a stage having an electrostatic chuck having a simple structure and capable of being formed at low cost.

It is another object of the present invention to provide a stage capable of suppressing leakage of a heat transfer gas supplied to an electrostatic chuck when a target substrate is processed at a low-temperature in a vacuum atmosphere.

It is still another object of the present invention to provide a stage capable of rapidly supplying a heat transfer gas onto the entire lower surface of an electrostatic chuck at a uniform pressure.

According to the present invention, there is provided a stage for holding a substrate having a major surface serving as a surface to be treated and a lower surface opposite to the major surface, comprising: a stage main body having a support surface for supporting the substrate through the lower surface, a groove being formed in the support surface, and a gas path communicating with the groove being formed in the stage main body; a thermal source incorporated in the main body to control a temperature of the substrate; a sheet electrostatic chuck having a lower surface airtightly adhered to the support surface to cover the groove, a plurality of through holes being formed in the electro-static chuck, and the through holes being arranged along and above the groove; power supply means connected to the electrostatic chuck; and means for supplying a heat transfer gas into the gas path, the heat transfer gas being supplied between the substrate and the electrostatic chuck through the groove and the through holes to contribute to transfer of thermal energy from the thermal source to the substrate.

In a stage according to the present invention, the following advantages are obtained. Since no side opening is formed in a susceptor unlike in a conventional stage, a trouble caused by leakage does not easily occur. The structure of the susceptor is simplified, and, therefore, the number of manufacturing steps can be decreased. An electrostatic chuck can be easily replaced. The conductance of the supply path for a heat transfer gas is increased, and a pressure reducing speed obtained when an initial low pressure is set before a wafer is placed is easily increased. The supply path is not easily clogged with a deposit, and, therefore, formation of particles caused by the deposit can be suppressed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a schematic sectional view showing a plasma etching apparatus according to the present invention;

FIG. 5 is a plan view showing a modification of a stage according to the present invention;

FIG. 6 is a plan view showing another modification of the stage according to the present invention;

FIG. 11 is a schematic sectional view showing another modification of the ionizer according to the present invention;

FIG. 12 is a schematic sectional view showing still another modification of the ionizer according to the present invention;

DETAILED DESCRIPTION OF THE PREFERRED EMBODIMENTS

Figure 2:
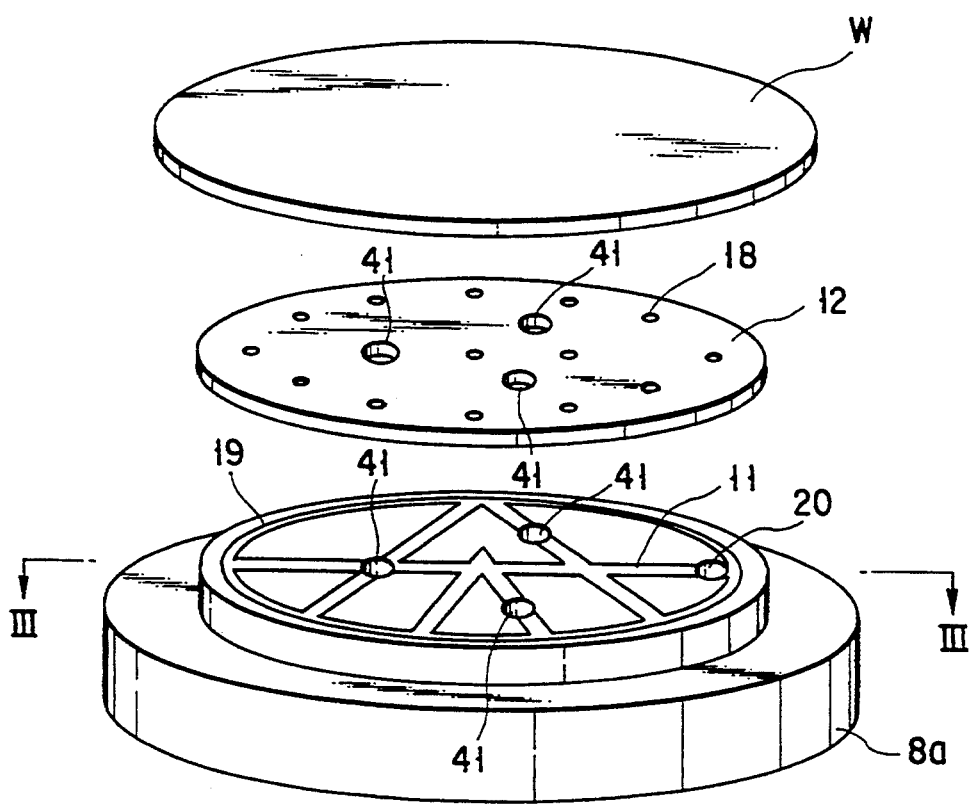
FIG. 2 is a developed perspective view showing the stage of the apparatus shown in FIG. 1.

Referring to FIG. 1, a plasma etching apparatus 1 comprises a process chamber 4 constituted by an inner cylinder 2 and an outer cylinder 3 which consist of a material such as aluminum. The inner cylinder 2 is constituted by a cylindrical side portion 2a, a bottom portion 2b formed from the lower end of the side portion 2a to have a small interval at the upper portion of the bottom portion 2b, and a flange 2c formed at the outer peripheral portion of the lower end of the side portion 2a. On the other hand, the outer cylinder 3 is constituted by a side portion 3a and a top portion 3b, and is mounted on the flange 2c to airtightly cover the inner cylinder 2.

A gas supply path 5a capable of supplying a process gas such as an HF gas from a process gas source 5b into the process chamber 4 through a mass-flow controller (MFC) 5c is arranged at an upper portion of the side portion 3a. A gas exhaust path 6a connected to a vacuum pump 6b is arranged at an opposite lower portion of the side portion 3a, thereby evacuating the process chamber 4.

A magnetic field generation member, e.g., a permanent magnet 7, for forming a horizontal magnetic field on the surface of a target substrate, e.g., a semiconductor wafer W, is rotatably arranged above the top portion 3b of the outer cylinder 3. When the horizontal magnetic field and an electric field perpendicular to each other are formed, a magnetron discharge can be generated in the process chamber 4.

As shown in FIG. 1, a stage 8 for placing and fixing the wafer W is arranged in the process chamber 4. The stage 8 is mounted on the bottom portion 2b in the inner cylinder 2 through a plurality of insulating members 9. An O-ring-like insulating member 10 is interposed between the side surface of the stage 8 and the side portion 2a of the inner cylinder 2. The stage 8 is held to be insulated from the inner cylinder 2 and the outer cylinder 3 which are grounded.

The stage 8 has three members 8a, 8b, and 8c stacked in the form of layers. As shown in FIG. 2, a groove 11 according to the present invention is formed in the flat placing surface of the susceptor 8a serving as the upper layer of the stage 8. A sheet-like electrostatic chuck 12 is fixed on the placing surface of the susceptor 8a with an adhesive.

Figure 3:
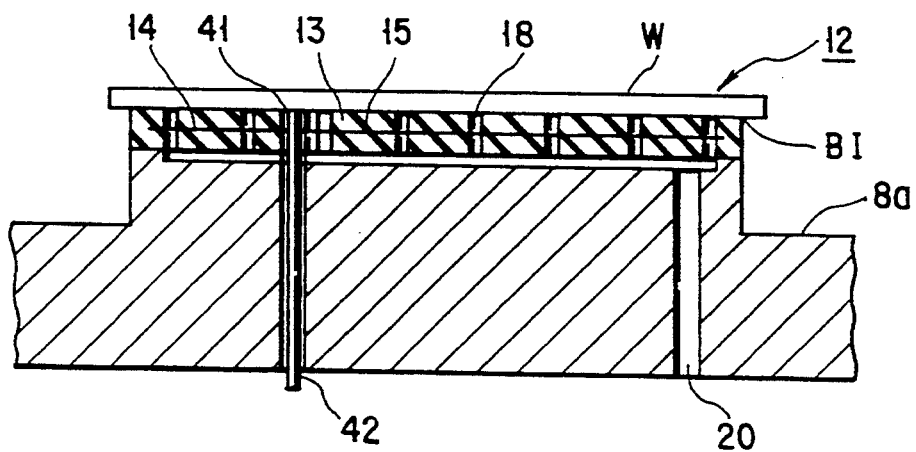
FIG. 3 is an enlarged sectional view showing the susceptor of the stage of the apparatus shown in FIG. 1.

The electrostatic chuck 12, as shown in FIG. 3, comprises a pair of dielectric films 13 and 14 which consist of a polyimide resin and are adhered to each other, and a chuck electrode 15 consisting of a thin conductive film such as a copper foil sealed between the films 13 and 14. The chuck electrode 15 is connected to a DC power supply 17 through a lead having a switch 16. The electrostatic chuck 12 is generally formed in the form of a circular flat sheet to have almost the same shape as that of the semiconductor wafer W. The electrostatic chuck 12 is airtightly adhered to the susceptor 8a by an adhering means such as the adhesive so as to prevent leakage of a heat transfer gas supplied into the groove 11.

In plasma etching, the positive terminal of the DC power supply 17 having a voltage of, e.g., 2.0 kv, is connected to the chuck electrode 15 of the electrostatic chuck 12. The wafer W is grounded through a plasma and the inner and outer cylinders 2 and 3. In this manner, polarization is caused in the upper dielectric film 13 of the electrostatic chuck 12, and the semiconductor wafer W is attracted and held on the electrostatic chuck 12 by Coulomb's force generated between the electrostatic chuck 12 and the semiconductor wafer W.

As shown in FIGS. 1 to 3, a plurality of through holes 18 are formed in the electrostatic chuck 12 to vertically extend through it. All the through holes 18, as shown in FIG. 2, are formed along the groove 11 formed in the placing surface of the susceptor 8a, and are positioned above the groove. The opening of a path 20 for supplying a heat transfer gas is positioned at the groove 11. The path 20 is connected to a heat transfer gas source 21 for an inert gas such as He or $N_2$, and the heat transfer gas is supplied onto the electrostatic chuck 12 through the path 20. The heat transfer gas is supplied, through the through holes 18, into an interstice BI between the electrostatic chuck 12 and the wafer W.

As the heat transfer gas, an inert gas such as He, $N_2$, Ne, Ar, Kr, Xe, or Rn can be used. Not only an inert gas but also any gas, which can transfer cold with a minimum heat loss and does not easily react with a process gas in the process chamber 4 even if leakage occurs, can be used as the heat transfer gas. If necessary, the reaction in the process chamber 4 may be positively promoted by the heat transfer gas.

A temperature adjustment member, e.g., a heater 22, for adjusting the temperature of the wafer W is arranged in the heater fixing frame 8b serving as the intermediate layer of the stage 8. The heater 22 is connected to a heater controller (not shown) to control the temperature of the susceptor 8a in accordance with a signal from a temperature monitor (not shown) for monitoring the temperature of the susceptor 8a or the heater fixing frame 8b. The temperature control of the susceptor 8a is disclosed in copending application Preliminary Ser. No. 08/154,451, the teachings of which are hereby incorporated by reference.

The susceptor 8a is detachably fixed to the heater fixing frame 8b by connection members such as screws 23. Therefore, when the susceptor 8a is contaminated or damaged, only the susceptor 8a can be replaced with a new one independently of the heater fixing frame 8b connected to an RF power supply 24, and maintenance of the apparatus can be easily performed.

A bore 26 for storing a coolant 25 such as liquid nitrogen is formed inside the cooling block 8c serving as the lower layer of the stage 8. The bore 26 communicates with a liquid nitrogen source 29 by a pipe 27 through a valve 28. A liquid level monitor (not shown) is arranged in the bore 26, and the valve 28 is opened/closed in response to a signal from the liquid Level monitor, thereby controlling an amount of the coolant 25 supplied into the bore 26. The bottom surface of the bore 26 is formed to be porous so as to be able cause nuclear boiling of the liquid nitrogen. Therefore, the temperature difference between the liquid nitrogen inside the cooling block 8c and the cooling block 8c can be kept at about 1° C.

As described above, the insulating member 10 such as an O-ring is interposed between the side wall of the susceptor 8a and the inner surface of the side portion 2a of the inner cylinder 2. Therefore, a process gas supplied into the process chamber does not reach a level lower than that of the susceptor 8a, so that the heater fixing frame 8b and the cooling block 8c are prevented from being contaminated. The stage 8 is insulated by the insulating members 9 and 10 from the inner cylinder 2 and the outer cylinder 3 constituting the process chamber 4 so as to constitute a cathode coupling having the same electric polarity. The RF power supply 24 is connected to the heater fixing frame 8b through a matching device 30. In this manner, the susceptor 8a and the grounded outer cylinder 3 constitute counter electrodes. When RF power is applied across these electrodes, a plasma discharge can be generated therebetween. An embodiment of the electric insulation between the stage 8 and members located outside the process chamber 4 is disclosed in copending application Ser. No. 08/104,475 filed on Jul. 28, 1993, the teachings of which are hereby incorporated by reference.

A lower space 31 and a side space 32 which communicate with each other are formed by the insulating members 9 and 10 between the stage 8 and the inner cylinder 2. The spaces 31 and 32 can be evacuated by a vacuum pump 33b through an exhaust path 33a.

Gaps 34 and 35 are formed between the susceptor 8a and the heater fixing frame 8b and between the heater fixing frame 8b and the cooling block 8c, respectively. The gaps 34 and 35 are airtightly constituted by seal members 36 and 37, e.g., O-rings. A heat transfer gas supplied from a gas source 39 through a path 38 can be sealed in the gaps 34 and 35.

Each of the gaps 34 and 35 is formed to have a size of 1 to 100 μm, more preferably, about 50 μm. As the heat transfer gas sealed in the gaps 34 and 35, the same gas as the heat transfer gas supplied between the electrostatic chuck 12 and the lower surface of the semiconductor wafer W can be used. That is, an inert gas such as He, $N_2$, Ne, Ar, Kr, Xe, or Rn can be used. Not only an inert gas but also any gas, which can transfer cold with a minimum heat loss and does not easily react with a process gas in the process chamber 4 even if leakage occurs, can be used as the heat transfer gas.

As described above, the heat transfer gas from the gas source 21 is temporarily supplied into the groove 11 formed in the upper surface of the susceptor 8a. The heat transfer gas is supplied at a uniform gas pressure from the groove 11 into the interstice BI between the electrostatic chuck 12 and the wafer W through the through holes 18 formed in the electrostatic chuck 12. The interstice BI is not sealed by the seal members 36 and 37 unlike the gaps 34 and 35. However, since the wafer W is attracted and fixed on the electrostatic chuck 12 by its Coulomb's force, a heat transfer gas having a pressure of less than 20 Torr can be sealed in the interstice BI by the Coulomb's force.

Three vertically extending through holes 41 (only two of them are shown in FIG. 1) are formed in the stage 8 and the electrostatic chuck 12. Vertically movable pins 42 consisting of a conductive material is arranged in the through holes 41, respectively. The lower end portion of each of the three pins 42 extends through the bottom portion 2b of the inner casing 2, and is mounted on a support plate 43 consisting of an insulating material under the bottom portion 2b. The pins 42 can be selectively grounded through a line having a switch 48. The support plate 43 is fixed on an output reciprocating rod 46 of a driving member 45. Therefore, the three pins 42 are vertically moved at once by the driving member 45 to assist a transfer arm 52 shown in FIG. 4 in loading/unloading the wafer W.

The three vertically movable pins 42 are surrounded by a bellows 47 between the support plate 43 and the bottom portion 2b of the inner casing 2. The support plate 43, the bottom portion 2b, and the bellows 47 form an airtightly sealed space. Each of the pins 42 is airtightly surrounded by the insulating seal rings 36 and 37 and an insulating seal pipe 44. Therefore, airtight communication can be performed from the top portion of each of the through holes 41 to the space surrounded by the bellows 47 on the support plate 43.

An ionizer 71 for supplying an ionized gas into the interstice BI between the wafer W and the electrostatic chuck 12 is connected to the path 20 for the heat transfer gas. The ionized gas is used to reduce residual charges left on the semiconductor wafer W and the electrostatic chuck 12 after the chuck electrode 15 is disconnected from the DC power supply 17.

Figure 9:
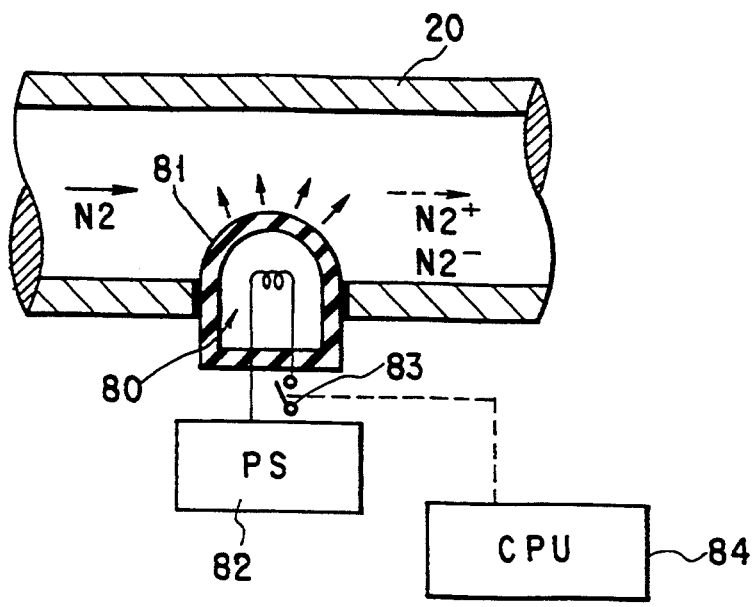
FIG. 9 is a schematic sectional view showing an ionizer of the apparatus shown in FIG. 1.

The ionizer 71 is connected to the gas source 21 through a valve 72 such as an air-operated valve for starting or stopping supply of the heat transfer gas and a MFC 73 for controlling the supply amount of heat transfer gas. As shown in FIG. 9, the ionizer 71 comprises an ultraviolet lamp 80 having a glass window 81 formed at its distal end portion and airtightly arranged in the path 20. A power supply 82 is connected to the ultraviolet lamp 80 through an electromagnetic switch 83. The switch 83 is turned on or off in response to a control signal from a controller 84 of the apparatus. When the electromagnetic switch 83 is turned on in response to the control signal from the controller 84, the ultraviolet lamp 80 is turned on to generate an ultraviolet beam, and the heat transfer gas in the path 20 is ionized with this ultraviolet beam. The ionized heat transfer gas, e.g., positively or negatively charged He, flows downstream in the path 20.

As a gas ionized to perform this operation, an inert gas such as He, $N_2$, Ne, Ar, Kr, Xe, or Rn can be used. As indicated by broken lines in FIG. 1, an exclusive gas source 74 such as an $N_2$ source may be arranged independently of the heat transfer gas source 21 as another gas source. When the $N_2$ gas source is used, $N_2$ is ionized to $N_2^+$ and $N_2^-$ by the ionizer 71, and $N_2^+$ and $N_2^-$ flow downstream in the path 20.

The arrangement of an etching system including the plasma etching apparatus will be described below with reference to FIG. 4. Note that the same reference numerals as in the plasma etching apparatus described above denote the same parts in the etching system, and a description thereof will be omitted.

Figure 4:
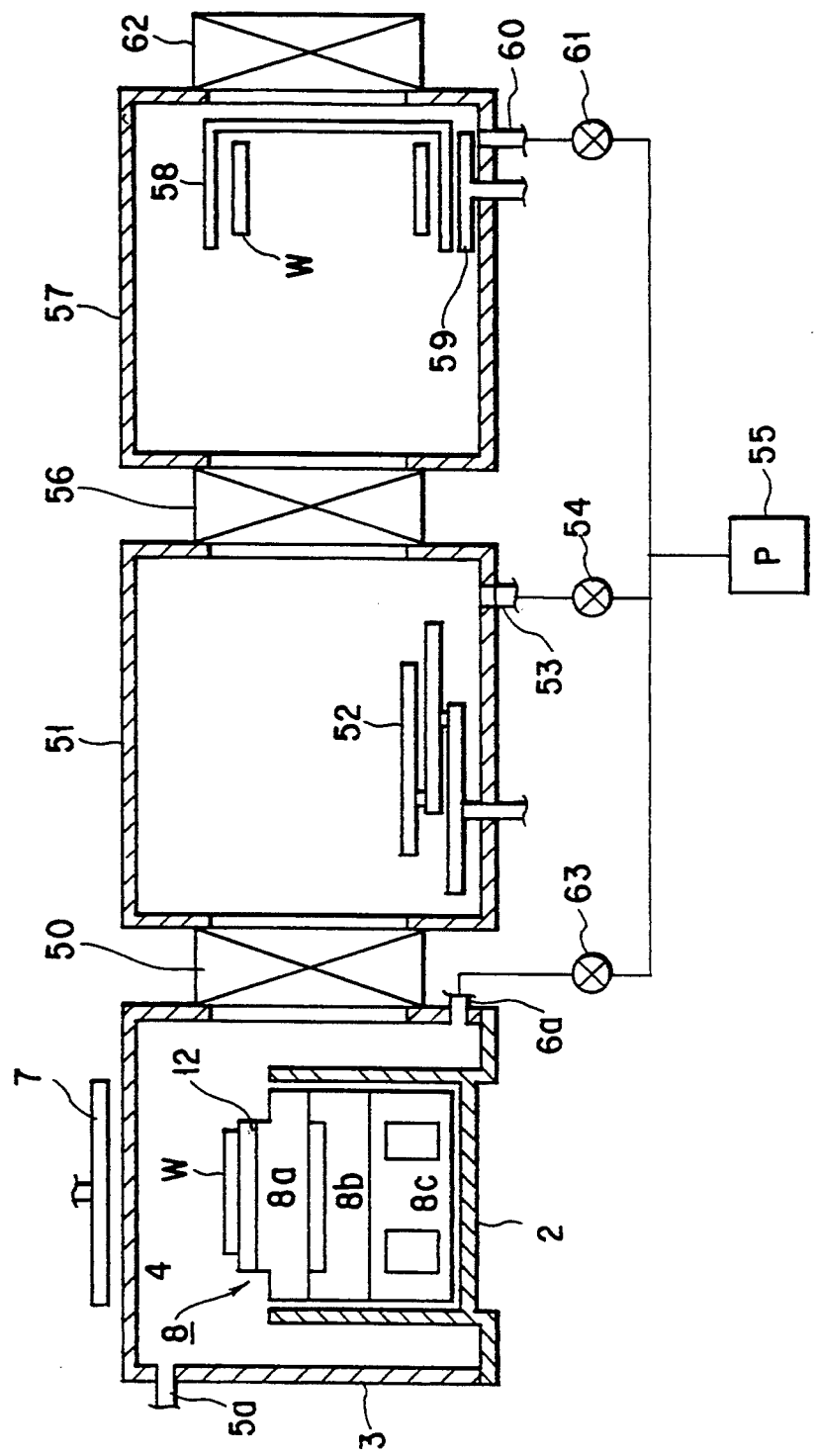
FIG. 4 is a schematic sectional view showing an etching system including the apparatus shown in FIG. 1.

As shown in FIG. 4, a load lock chamber 51 is connected to the outer cylinder 3 of the process chamber 4 of the magnetron plasma etching apparatus 1 according to the present invention through an openable gate 50. The transfer arm 52, e.g., an aluminum convey arm, which is subjected to anti-electrostatic treatment by coating a conductive Teflon material, is arranged in the load lock chamber 51. An exhaust pipe 53 is connected to an exhaust port formed in the bottom of the load lock chamber 51. A vacuum pump 55 is connected to the exhaust pipe 53 through a vacuum exhaust valve 54 to be able to evacuate the load lock chamber 51.

A cassette chamber 57 is connected to a side wall of the load lock chamber 51 through an openable gate 56. A stage 59 for placing a cassette 58 is arranged in the cassette chamber 57. The cassette 58 can store 25 semiconductor wafers W serving as target substrates. An exhaust pipe 60 is connected to an exhaust port formed in the bottom of the cassette chamber 57. The vacuum pump 55 is connected to the exhaust pipe 60 through a vacuum exhaust valve 61 to be able to evacuate the cassette chamber 57. The other side wall of the cassette chamber 57 communicates with the atmospheric air through an openable gate 62.

An operation of the etching system described above will be described below.

The gate 62 arranged between the cassette chamber 57 and the atmospheric air is opened, the cassette 58 storing the wafers W is placed on the stage 59 of the cassette chamber 57 by a convey robot (not shown), and the gate 62 is closed. The vacuum exhaust valve 61 connected to the cassette chamber 57 is opened, and the cassette chamber 57 is exhausted by the vacuum pump 55 to a low-pressure atmosphere, e.g., $10^{-1}$ Torr.

The gate 56 between the load lock chamber 51 and the cassette chamber 57 is opened, and one of the wafers W is picked by the transfer arm 52 from the cassette 58 placed in the cassette chamber 57. The wafer W is transferred into the load lock chamber 51 by the transfer arm 52, and the gate 56 is closed. The exhaust pipe 53 connected to the load lock chamber 51 is opened, and the load lock chamber 51 is exhausted by the vacuum pump 55 to a low-pressure atmosphere, e.g., $10^{-3}$ Torr.

In the meantime, in the process chamber 4, a process gas from the gas source 39 is sealed in the gaps 34 and 35. Thermal energy, i.e., cold, of the coolant 25 is transferred to the susceptor 8a to cool the susceptor 8a to a predetermined temperature.

The gate 50 between the load lock chamber 51 and the process chamber 4 is opened, and the wafer W is transferred into the process chamber 4 by the transfer arm 52. The wafer W is placed on the stage 8, and the gate 50 is closed. When the wafer W is placed on the stage 8, the vertically movable pins 42 are grounded, and the chuck electrode 15 is connected to the DC power supply 17. For this reason, the lower surface of the wafer W grounded through the pins 42 is negatively charged, and the upper surface of the dielectric film 13 of the electrostatic chuck 12 is positively charged. For this reason, an electrostatic attractive force is generated between the wafer W and the electrostatic chuck 12, and the wafer W is attracted and held on the stage 8.

After the pins 42 are moved downward to release the wafer W, since the wafer W is not grounded, the wafer W is attracted to the electrostatic chuck 12 by residual charges. However, this attractive force is weaker than the attractive force generated when the wafer W is grounded. However, when a plasma is produced in the process chamber 4, the wafer W is grounded through the plasma again, and the attractive force of the electrostatic chuck 12 become strong.

A heat transfer gas whose pressure is adjusted to a predetermined pressure is supplied into the interstice BI between the electrostatic chuck 12 and the wafer W. Cold or thermal energy from the coolant 25 is efficiently transferred to the wafer W by the heat transfer gas to cool the wafer W to an appropriate temperature. The process chamber 4 is exhausted by the vacuum pump 55 to a low-pressure atmosphere, e.g., $10^{-5}$ Torr, in advance. A process gas, e.g., an HF gas, is supplied from the gas supply path 5a into the process chamber 4. When RF power is applied from the RF power supply 24 to the heater fixing frame 8b, the process gas is made into a plasma, and RIE type plasma etching can be performed. The permanent magnet 7 arranged above the process chamber 4 is rotated to form a magnetic field parallel to the surface of the wafer W near the wafer W. In this manner, ions can be directed perpendicularly to the wafer W, and etching having a high anisotropy can be achieved.

Upon completion of desired etching processing, the RF power supply 24 is disconnected, and the supply of the process gas is stopped so as to stop generation of the plasma. In addition, an inert gas such as nitrogen is supplied into the process chamber 4 to substitute the process gas or reaction products in the process chamber 4, while the process chamber 4 is exhausted by the vacuum pump 55. The chuck electrode 15 is disconnected from the DC power supply 17, and the wafer waits for being transferred.

After the generation of the plasma is stopped, and the chuck electrode 15 is disconnected from the DC power supply 17, a charge-removing operation of the wafer W and the electrostatic chuck 12 is performed. For this reason, an He gas from the gas source 21 or an inert gas, e.g., an $N_2$ gas, from the gas source 74 is ionized by the ionizer 71, and the ionized gas is supplied onto the lower surface of the wafer W on the electrostatic chuck 12 through the path 20. That is, the UV lamp 80 shown in FIG. 9 is turned on, and He or $N_2$ is ionized by an ultraviolet beam.

For example, $N_2^+$ and $N_2^-$ generated by ionizing $N_2$ are supplied between the wafer W and the electrostatic chuck 12 through the path 20 while a flow rate of $N_2^+$ and $N_2^-$ is adjusted, positive charges attracted by the wafer W and negative charges attracted by the electrostatic chuck 12 are neutralized by the $N_2^+$ and $N_2^-$ gases, respectively, thereby performing a charge-removing operation of the wafer W and the electrostatic chuck 12.

A charge-removing time is determined as follows. That is, assuming that the distance between the ionizer 71 and the semiconductor wafer W is set to be about 25 cm and that a potential of 3 kv is left, positive charges can be removed within 3 seconds or less, and negative charges can be removed within 10 seconds or less to a potential of about 0.3 kv or less. As the distance between the ionizer 71 and the wafer W is shorter, the charge-removing time can be shortened. The distance is preferably set to be 20 cm or less.

In addition, when the ionized gas is supplied onto the wafer W and the electrostatic chuck 12, the time required for performing a charge-removing operation of the wafer W and the electrostatic chuck 12 is shorter in an atmospheric pressure atmosphere than in a low-pressure atmosphere. For example, the charge-removing time at a pressure of $1 \times 10^{-2}$ Torr or less can be shortened by 1.5 times or more the charge-removing time obtained at the atmospheric pressure.

After the residual process gas and reaction products in the process chamber 4 are sufficiently exhausted, the gate 50 arranged on the side of the process chamber 4 is opened. The wafer W is lifted from the electrostatic chuck 12 by the pins 42. The transfer arm 52 moves to the position of the wafer W to receive the wafer W from the pins 42. After the transfer arm 52 transfers the wafer W to the load lock chamber 51, the gate 50 is closed. In the load lock chamber, the wafer W is heated by the heater to a room temperature, e.g., 18° C. Thereafter, the wafer W is unloaded from the lead lock chamber 51 into the air through the cassette chamber 57.

The structure and operation of the groove 11 formed in the upper surface of the susceptor 8a will be described below with reference to FIGS. 2 and 5 to 7.

In the embodiment shown in FIG. 2, the groove 11 has a uniform depth and is formed all over the surface of the susceptor 8a as shown in FIG. 2. In the example shown in FIG. 2, the groove 11 has a width of 1.2 mm and a depth of 1.5 mm. The groove 11 may be constituted to have a width and a depth at a ratio of 1:2. The width of the groove 11 preferably falls within a range of 0.5 to 3 mm. If the width is smaller than this range, circulation of the heat transfer gas may be disturbed; if the width is larger than the range, a polyimide resin film of the electrostatic chuck 12 is expanded by supplying the heat transfer gas, and it may not be able to preferably hold and attract the wafer W. The depth of the groove 11 is preferably set to be 0.5 mm or more. If the depth is smaller than this range, an adhesive for adhering the electrostatic chuck 12 may clog up the groove 11.

As shown in FIG. 2, the flat mounting surface of the susceptor 8a has a diameter substantially equal to that of the electrostatic chuck 12. That is, in this embodiment, the area of the mounting surface is substantially equal to the area of the lower surface of the electrostatic chuck 12. The total area of the groove 11 in the plan view, i.e., the opening area of the groove 11, is preferably set to be 15% or less than 15% of the area of the lower surface of the electrostatic chuck 12. If the area is larger than the range, the attraction force obtained may be insufficient.

An endless loop groove or annular groove portion 19 is formed along the peripheral edge of the mounting surface of the susceptor 8a. The endless loop groove portion 19 functions as a reservoir for the heat transfer gas, and has a role of assuring good heat transfer properties at the peripheral portion of the wafer W where the heat transfer gas easily escapes into the process chamber 4. Therefore, the endless loop groove portion 19 has a sectional area of 2 to 4 mm$^2$, and is preferably formed on the mounting surface of the susceptor 8a to correspond to a region distant from the peripheral edge of the electrostatic chuck 12 by smaller than 5 mm.

The through holes 41 for the vertically movable pins 42 are arranged to communicate with the groove 11. In this manner, the heat transfer gas can be supplied into the through holes 41. The through holes 41 can exhaust the gas through the groove 11 when an initial low pressure is set before the wafer W is not placed. Since the three through holes 41 communicate with each other through an airtight space surrounded by the bellows 47, when at least one of the through holes 41 communicates with the groove 11, all the through holes 41 communicate with the groove 11. The heat conductivity in the through holes 41 can be increased by supplying therein the heat transfer gas. If necessary, the heat transfer gas can be supplied into the through holes 41 by connecting the line for the heat transfer gas to the support plate 43.

The electrostatic chuck 12 is adhered to the entire mounting surface of the susceptor 8a except for a portion where the groove 11 is formed. The through holes 18 formed in the electrostatic chuck 12 are almost uniformly distributed on the entire surface of the electrostatic chuck 12, and arranged to communicate with the groove 11. The diameter of each of the through holes 18 falls within a range of 0.6 to 1.5 mm. The 60 to 70 through holes 18 are formed in an electrostatic chuck for a 6" wafer, and the 100 to 120 through holes are formed in an electrostatic chuck for an 8" wafer.

A heat transfer gas having a pressure of 5 to 15 Torr, preferably, 10 Torr is supplied from the heat transfer gas source 21 into the groove 11 through the path 20. The heat transfer gas is supplied from the groove 11 into the interstice BI between the electrostatic chuck 12 and the wafer W through the through holes 18 of the electrostatic chuck 12. In stopping the operation of the apparatus, when the DC power supply 17 is turned off while the heat transfer gas is left in the interstice BI, the wafer W may be jumped from the susceptor 8a due to the pressure of the residual gas. Therefore, after the heat transfer gas is evacuated from the interstice BI between the electrostatic chuck 12 and the wafer W, the DC power supply 17 is turned off.

Figure 7:
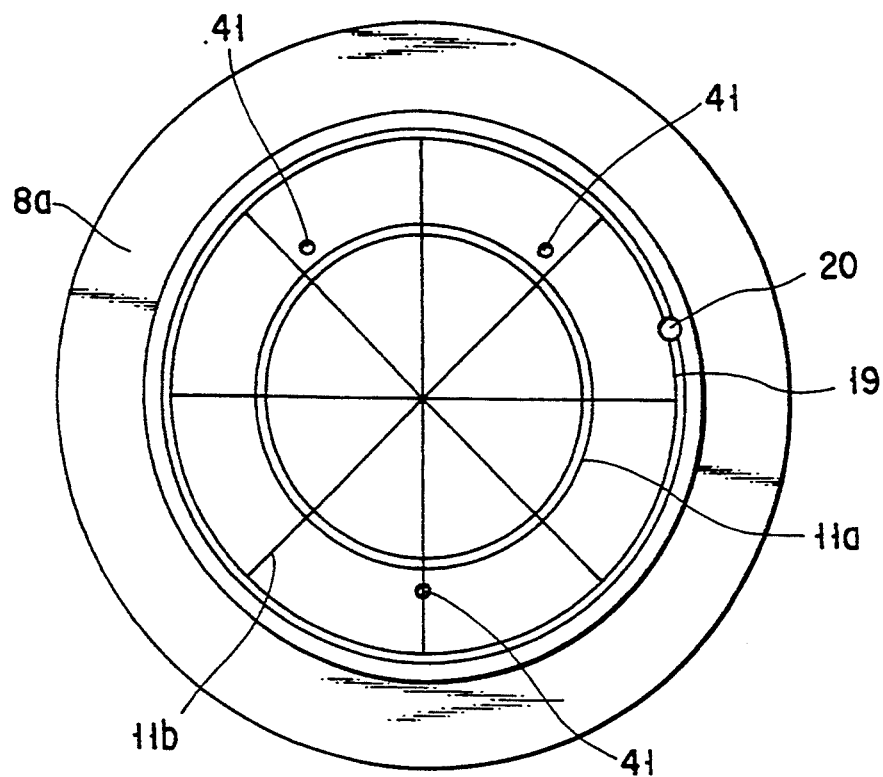
FIG. 7 is a plan view showing still another modification of the stage according to the present invention.

FIGS. 5 to 7 show modifications of the stage according to the present invention. The same reference numerals as in FIGS. 5 to 7 denote the same parts in FIGS. 1 to 3, and a description thereof will be omitted.

In these embodiments, each groove 11 is constituted by large groove elements 11a having a depth of 2 mm and a width of 2 mm and small groove elements 11b each having a depth of 0.5 mm and a width of 1 mm. Each annular groove portion 19 is formed as the large groove 11a. Referring to FIGS. 5 to 7, each of the large groove elements 11a is indicated by a double line, and each of the small groove elements 11a is indicated by a single line. When each of the grooves 11 is constituted by the large groove elements 11a and the small groove elements 11b, the heat transfer gas supplied from the path 20 can be efficiently, rapidly supplied onto the entire surface of a susceptor by the large groove elements 11a, and a heat conduction medium can be distributed to fine portions of the upper surface of the susceptor by the small groove elements 11b. With the above arrangement, the heat transfer gas can be efficiently, rapidly distributed to the lower surface of the electrostatic chuck 12 at a uniform pressure. In this case, the sectional area of each of the large groove elements 11a preferably falls within a range of 2 to 4 mm$^2$, and the sectional area of each of the small groove elements 11b preferably falls within a range of 0.5 to 1.0 mm$^2$.

In the modification shown in FIG. 5, an annular groove portion 19 and a groove portion for connecting the annular groove portion 19 to the opening of a path 20 are constituted by the large groove elements 11a, and the small groove elements 11b are formed in the form of veins. In the modification shown in FIG. 6, as in the modification shown in FIG. 5, the annular groove portion 19 and a groove portion for connecting the annular groove portion 19 and the opening of the path 20 are constituted by the large groove elements 11a, and the small groove elements 11b are formed in a matrix form. In the modification shown in FIG. 7, the large groove element 11a is coaxially arranged inside the annular groove portion 19, and the small groove elements 11a are radially arranged. The shape of the groove 11 is not limited to the shapes of the modifications shown in FIGS. 5 to 7, and any groove which can efficiently, rapidly distribute the heat transfer gas onto the surface of the susceptor 8a, i.e., the entire lower surface of the electrostatic chuck 12 can be used as the groove 11. Various modifications can be constituted without departing from the spirit and scope of the invention.

Figure 8:
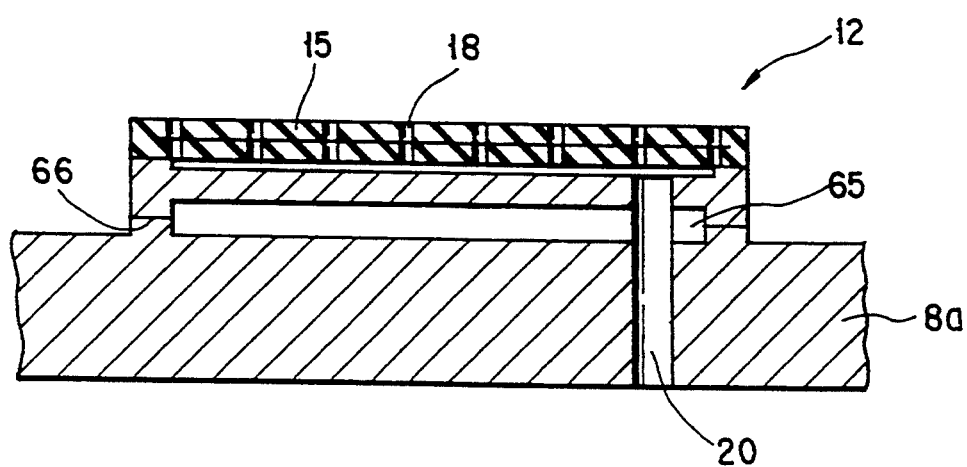
FIG. 8 is a sectional view showing still another modification of the stage according to the present invention.

FIG. 8 shows still another modification of a stage according to the present invention. The same reference numerals as in FIGS. 1 to 3 denote the same parts in FIG. 8, and a description thereof will be omitted.

In the example shown in FIG. 8, a reservoir 65 is formed midway along a path 20. In this manner, the pressure of a heat transfer gas supplied from a gas source 21 is uniformed, and a supply speed can be increased. A seam 66 for forming the reservoir 65 in a susceptor 8a is sealed by a means such as welding not to cause leakage of the heat transfer gas.

Figure 10:
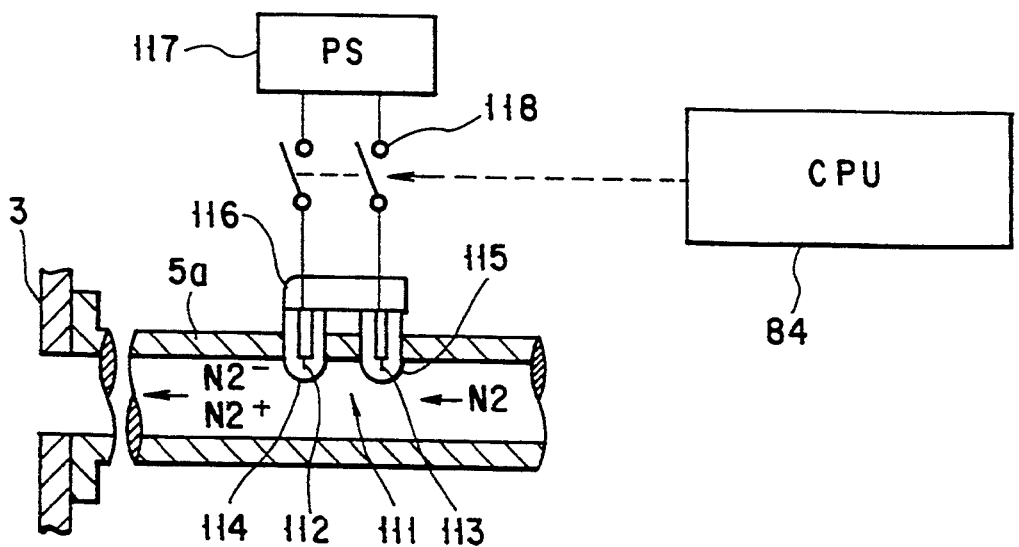
FIG. 10 is a schematic sectional view showing a modification of the ionizer according to the present invention.

FIG. 10 shows an ionizer 111 which can be arranged in the gas supply path 5a and is used to perform a charge-removing operation. As shown in FIG. 10, the ionizer 111 comprises discharge rods 112 and 113, independently coated with quartz glass members 114 and 115, for generating a corona discharge. The distal end portions of the quartz glass members 114 and 115 are buried in the supply path 5a, and the peripheral portions of the distal end portions of the quartz glass members 114 and 115 are airtightly connected to the supply tube 5a. The discharge rods 112 and 113 extend through an insulator 116, e.g., a ceramic material, for preventing an electric shock, and are connected to a power supply 117 through electromagnetic switches 118, respectively. Each of the electromagnetic switches 118 is turned on/off in response to a control signal from a controller 84.

Charges left on the lower surface of the wafer W and the surface of the electrostatic chuck 12 are removed by the ionizer 111 after generation of a plasma is stopped and a DC power supply 17 for the chuck electrode 15 is disconnected. First, an inert gas such as N$_2$ flows in the gas supply path 5a, and this gas is ionized to N$_2$+ and N$_2$− by the ionizer 111. An ionization atmosphere of N$_2$+ and N$_2$− is formed on the wafer W. In this manner, the charges left on the lower surface of the wafer W and the upper surface of the electrostatic chuck 12 are removed through the wafer W, the ionization atmosphere, and the inner and outer cylinders 2 and 3. This charge-removing operation may be performed in place of the charge-removing operation of the first embodiment in which a charge-removing operation is performed through the path 20, or both the charge-removing operation of this embodiment and the charge-removing operation of the first embodiment may be simultaneously performed.

FIG. 11 shows an ionizer 150 which can be arranged on the side wall of the process chamber 4 and is used to perform a charge-removing operation. As shown in FIG. 1, the ionizer 150 comprises discharge rods 151 and 152, covered with a quartz glass member 153, for generating a corona discharge. The quartz glass member is airtightly connected to an insulator, e.g., a ceramic base 154. The distal end portion of an extendible member 155, e.g., a bellows, is airtightly connected to the peripheral portion of the base 154. The proximal end of the extendible member 155 is airtightly connected to the inner peripheral portion of a hole portion 158 formed in the side wall of the process chamber 4.

The extendible member 155 includes a horizontally movable portion 157 which is driven by a driving member 156, e.g., a motor or an air cylinder. The distal end portion of the movable portion 157 is connected to the base 154. Therefore, the extendible member 155 can move the ionizer 150 from a position (when charges on the wafer W are removed) above the wafer W to a position (when the wafer W is subjected to plasma processing) where the ionizer 150 is withdrawn from the position above the wafer W.

Wires 160 and 161 for supplying a voltage to the discharge rods 151 and 152 are arranged in the extendible member 155 and connected to the power supply 117 through electromagnetic switches 162 and 163, respectively. The electromagnetic switches 162 and 163 are turned on/off in response to a control signal from an apparatus controller 84 for controlling the apparatus.

Charges left on the lower surface of the wafer W and the surface of the electrostatic chuck 12 are removed by the ionizer 150 after generation of a plasma is stopped and a power supply 17 for the chuck electrode 15 is disconnected. First, the ionizer 150 extends to the position above the wafer W. An inert gas such as N$_2$ flows in a gas supply path 5a, and this gas is ionized to N$_2$+ and N$_{2hu}$ − by the ionizer 150 to form an ionization atmosphere of N$_2$+ and N$_2$− on the wafer W. In this manner, the charges left on the lower surface of the wafer W and the upper surface of the electrostatic chuck 12 are removed through the wafer W, the ionization atmosphere, and the inner and outer cylinders 2 and 3. This charge-removing operation may be performed in place of the charge-removing operation of the first embodiment in which a charge-removing operation is performed through the path 20, or both the charge-removing operation of this embodiment and the charge-removing operation of the first embodiment may be simultaneously performed.

FIG. 12 shows an ionizer 180 which can be arranged in an auxiliary chamber connected to the process chamber 4 and is used to perform a charge-removing operation. As shown in FIG. 12, an opening 181 is formed in the side wall of the process chamber 4, and is opened/closed by a gate 182. When the gate 182 is closed, an O-ring arranged in the side wall of the process chamber 4 is pressed by the gate 182 so as to airtightly close the process chamber 4. An auxiliary chamber 183 is connected to the opening 181 through the gate 182. A transfer arm 185 is arranged in the auxiliary chamber 183, and an ultraviolet lamp 184 is supported on the transfer arm 185. The ultraviolet lamp 184 can be horizontally moved above the wafer W on a stage 8 by the transfer arm 185. The ultraviolet lamp 184 is ON/OFF-controlled by a controller (not shown).

Charges left on the lower surface of the wafer W and the surface of the electrostatic chuck 12 are removed by the ionizer 180 after generation of a plasma is stopped and a power supply 17 for the chuck electrode 15 is disconnected. First, the transfer arm 185 extends to position the lamp 184 in the process chamber 4. An inert gas such as $N_2$ flows in a gas supply path 5a, and this gas is ionized to $N_2^+$ and $N_2^-$ by the ionizer 180 to form an ionization atmosphere of $N_2^+$ and $N_2^-$ on the wafer W. In this manner, the charges left on the lower surface of the wafer W and the upper surface of the electrostatic chuck 12 are removed through the wafer W, the ionization atmosphere, and the inner and outer cylinders 2 and 3. This charge-removing operation may be performed in place of the charge-removing operation of the first embodiment in which a charge-removing operation is performed through the path 20, or both the charge-removing operation of this embodiment and the charge-removing operation of the first embodiment may be simultaneously performed.

In using each of the ionizers 111, 150 and 180 shown in FIGS. 10 to 12, a charge-removing operation may be performed while the wafer W is lifted by vertically movable pins 42 which are grounded. In this case, a charge-removing operation of the lower surface of the wafer W is mainly performed through the pins 42, and a charge-removing operation of the upper surface of the electrostatic chuck 12 is performed by each of the ionizers. Only the charge-removing operation of the upper surface of the electrostatic chuck 12 may be performed by each of the ionizers after the wafer W is transferred into a load lock chamber 51 (see FIG. 4). In using each of the ionizers 150 and 180 shown in FIGS. 11 and 12, during a charge-removing operation, an ionization atmosphere may be formed by ionizing a residual gas in the process chamber 4 without supplying an inert gas through the gas supply path 5a. Modifications of such a charge-removing operation will be described below using the ionizer 180 shown in FIG. 12 as an example.

Upon completion of predetermined etching, generation of a plasma is stopped, and the DC power supply 17 for the chuck electrode 15 is disconnected. Vertically movable pins 42 which are grounded are moved upward to be brought into contact with the lower surface of a wafer W. A charge-removing operation of the lower surface of the wafer W is performed until the wafer W can be removed from the electrostatic chuck 12. The pins 42 are further moved upward to lift the wafer W from a stage 8. The arm 52 receives the wafer W to transfer it into a load lock chamber 51, and a gate 50 is closed.

Figure 13:
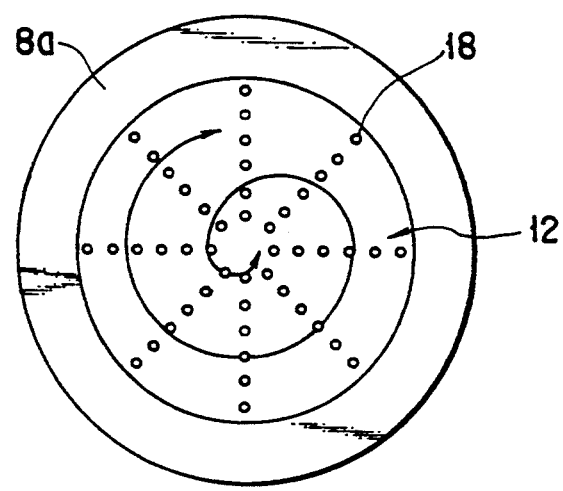
FIG. 13 is a plan view, corresponding to the stage shown in FIG. 7, for explaining an operation of the ultraviolet lamp of the ionizer shown in FIG. 12.
Figure 14:
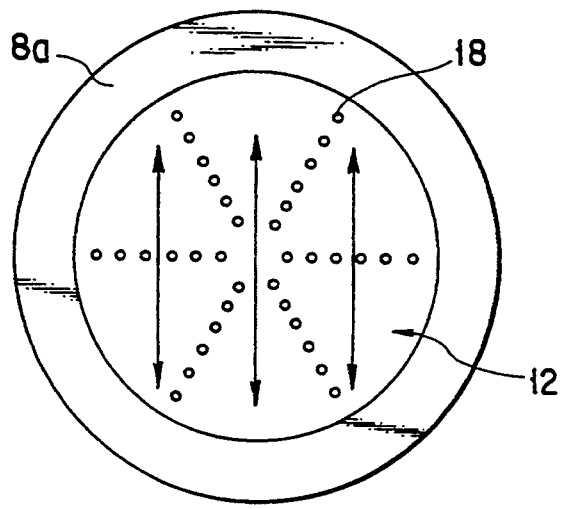
FIG. 14 is a plan view showing the stage to explain another operation of the ultraviolet lamp.
Figure 15:
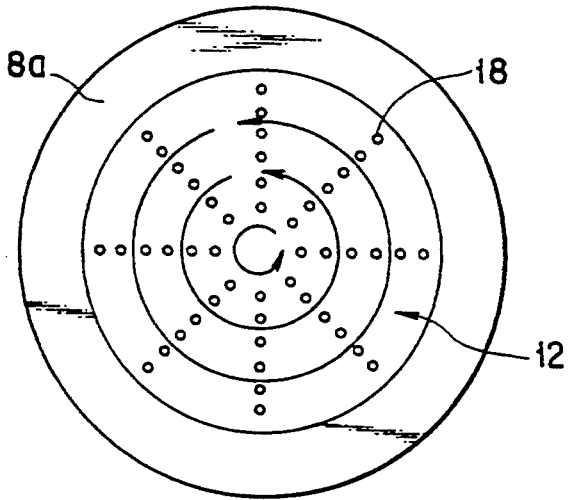
FIG. 15 is a plan view showing the stage to explain still another operation of the ultraviolet lamp.

The gate 182 is opened, and a transfer arm 185 extends to move the ultraviolet lamp 184 from the auxiliary chamber 183 into a process chamber 4. The ultraviolet lamp 184 is turned on and moved above the electrostatic chuck 12 so as to cover the entire area of the electrostatic chuck 12. As movements of the lamp 184, a spiral motion shown in FIG. 13, a reciprocating motion shown in FIG. 14, and a concentrically circular motion shown in FIG. 15 are considered.

The residual gas, e.g., a CO gas, in the process chamber 4 is ionized to $CO^+$ and $CO^-$ with an ultraviolet beam radiated from the lamp 184. An ionization atmosphere formed by the ionized gas causes charges left on the upper surface of the electrostatic chuck 12 to be removed through the ionization atmosphere and the inner and outer cylinders 2 and 3.

A charge-removing time is determined as follows. That is, assuming that the distance between the lamp 184 and the wafer W is set to be about 25 cm and that a potential of 3 kv is left, positive charges can be removed within 3 seconds or less, and negative charges can be removed within 10 seconds or less to a potential of about 0.3 kV or less. As the distance between the lamp 184 and the wafer W is shorter, the charge-removing time can be shortened. The distance is preferably set to be 20 cm or less.

The present invention is especially suitable for the stage of a plasma processing apparatus in which a heat transfer gas is required for controlling the temperature of a target substrate in a vacuum atmosphere. However, the present invention can be applied to not only the stage of the plasma processing apparatus but also a stage used in the air. In an atmosphere in which no plasma is produced, a means, such as a vertically movable pin of the apparatus shown in FIG. 1, for applying a potential different from that of a chuck electrode, may be arranged. As a plasma processing apparatus, in addition to a plasma etching apparatus, a plasma ashing apparatus and a plasma CVD apparatus can be used. As a target substrate, in addition to a semiconductor wafer, a substrate for an LCD can be used.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A stage for holding a substrate, the substrate having a major surface serving as a surface to be treated and a lower surface opposite to the major surface, comprising:

a stage main body having a support surface for supporting said substrate through the lower surface, a groove being formed in the support surface, and a gas path communicating with the groove being formed in said stage main body;

a thermal source incorporated in said main body to control a temperature of said substrate;

a sheet electrostatic chuck having a lower surface airtightly adhered to the support surface to cover the groove, a plurality of through holes being formed in said electrostatic chuck, and the through holes being arranged along and above the groove;

power supply means connected to said electrostatic chuck; and means for supplying a heat transfer gas into the gas path, the heat transfer gas being supplied between said substrate and said electrostatic chuck through the groove and the through holes to contribute to transfer of thermal energy from said thermal source to said substrate.

2. A stage according to claim 1, wherein an opening area of the groove on the support surface is set to be less than or equal to 15% of the lower surface area of said electrostatic chuck.

3. A stage according to claim 2, wherein the groove has an endless loop portion formed along a peripheral edge of said electrostatic chuck, the endless loop portion being formed on the support surface at a distance of less than 5 mm from the peripheral edge of said electrostatic chuck.

4. A stage according to claim 3, wherein the groove has a width of 0.5 to 3 mm and a depth of 0.5 mm or more.

5. A stage according to claim 4, wherein the endless loop portion has a cross sectional area of 2 to 4 $mm^2$.

6. A stage according to claim 5, wherein the groove comprises a large groove element having a cross sectional area of 2 to 4 $mm^2$ and a small groove element having a cross sectional area of 0.5 to 1.0 $mm^2$.

7. A stage according to claim 6, wherein the gas path is directly connected to the large groove element.

8. A stage according to claim 1, further comprising pins extendible from said electrostatic chuck, and auxiliary holes formed in said stage to store said pins, the auxiliary holes being arranged to communicate with the groove.

9. A stage according to claim 1, further comprising means for supplying an ionized gas into the gas path, wherein the ionized gas is supplied between said substrate and said electrostatic chuck through the groove and the through holes to remove charges left on said substrate and said electrostatic chuck.

10. A stage according to claim 1, wherein the support surface comprises a surface for supporting a semiconductor wafer.

11. A plasma processing apparatus for processing a substrate, the substrate having a major surface to be processed and a lower surface opposite to the major surface, by using a plasma of a process gas, while holding said substrate on a stage, comprising:

(a) a process chamber for enclosing said substrate;
(b) means for supplying the process gas into said process chamber;
(c) means for exhausting said process chamber and setting said process chamber in a vacuum state;
(d) means for making the process gas into the plasma in said process chamber; and
(e) said stage arranged in said process chamber, said stage comprising:

a stage main body having a support surface for supporting said substrate through the lower surface, a groove being formed in the support surface, and a gas path communicating with the groove being formed in said stage main body;

a thermal source incorporated in said main body to control a temperature of said substrate;
a sheet electrostatic chuck having a lower surface airtightly adhered to the support surface to cover the groove, a plurality of through holes being formed in said electrostatic chuck, and the through holes being arranged along and above the groove;
power supply means connected to said electrostatic chuck; and
means for supplying a heat transfer gas into the gas path, the heat transfer gas being supplied between said substrate and said electrostatic chuck through the groove and the through holes to contribute to transfer of thermal energy from said thermal source to said substrate.

12. An apparatus according to claim 11, wherein an opening area of the groove on the support surface is set to be 15% or less than 15% of an area of the lower surface of said electrostatic chuck.

13. An apparatus according to claim 12, wherein the groove has an endless loop portion formed along a peripheral edge of said electrostatic chuck, the endless loop portion being formed on the support surface at a distance of less than 5 mm from the peripheral edge of said electrostatic chuck.

14. An apparatus according to claim 13, wherein the groove has a width of 0.5 to 3 mm and a depth of 0.5 mm or more.

15. An apparatus according to claim 14, wherein the endless loop portion has a cross sectional area of 2 to 4 $mm^2$.

16. An apparatus according to claim 15, wherein the groove comprises a large groove element having a cross sectional area of 2 to 4 $mm^2$ and a small groove element having a cross sectional area of 0.5 to 1.0 $mm^2$.

17. An apparatus according to claim 16, wherein the gas path is directly connected to the large groove element.

18. An apparatus according to claim 11, further comprising pins extendible from said electrostatic chuck, and auxiliary holes formed in said stage to store said pins, the auxiliary holes being arranged to communicate with the groove.

19. An apparatus according to claim 11, further comprising means for supplying an ionized gas into the gas path, wherein the ionized gas is supplied between said substrate and said electrostatic chuck through the groove and the through holes to remove charges left on said substrate and said electrostatic chuck.

20. An apparatus according to claim 11, wherein the support surface comprises a surface for supporting a semiconductor wafer.

* * * * *